(12) United States Patent
Srinivasan et al.

(10) Patent No.: US 10,228,420 B2
(45) Date of Patent: Mar. 12, 2019

(54) CLOCK SELECTION CIRCUIT AND TEST CLOCK GENERATION CIRCUIT FOR LBIST AND ATPG TEST CIRCUIT

(71) Applicant: STMicroelectronics International N.V., Amsterdam (NL)

(72) Inventors: Venkata Narayanan Srinivasan, Gautam Budh Nagar District (IN); Nimit Endlay, Greater Noida (IN); Balwinder Singh Soni, Faridabad (IN)

(73) Assignee: STMicroelectronics International N.V., Schiphol (NL)

( * ) Notice: Subject to any disclaimer, the term of this patent is extended or adjusted under 35 U.S.C. 154(b) by 129 days.

(21) Appl. No.: 15/268,848

(22) Filed: Sep. 19, 2016

(65) Prior Publication Data

US 2018/0080987 A1 Mar. 22, 2018

(51) Int. Cl.

| | | |
|---|---|---|
| *G01R 31/317* | (2006.01) | |
| *G01R 31/3177* | (2006.01) | |
| *G01R 31/3193* | (2006.01) | |
| *G06F 11/26* | (2006.01) | |
| *G06F 11/25* | (2006.01) | |
| *G06F 11/27* | (2006.01) | |

(52) U.S. Cl.
CPC ... *G01R 31/31727* (2013.01); *G01R 31/3177* (2013.01); *G01R 31/31722* (2013.01); *G01R 31/31723* (2013.01); *G01R 31/31724* (2013.01); *G01R 31/31937* (2013.01); *G06F 11/25* (2013.01); *G06F 11/26* (2013.01); *G06F 11/27* (2013.01)

(58) Field of Classification Search
CPC .......... G06F 11/25; G06F 11/26; G06F 11/27; G01R 31/317; G01R 31/31701; G01R 31/31707; G01R 31/31722; G01R 31/31723; G01R 31/31724; G01R 31/31725; G01R 31/31727; G01R 31/3177; G01R 31/3181; G01R 31/31813; G01R 31/31; G01R 31/8385; G01R 31/318552; G01R 31/318536; G01R 31/318541; G01R 31/318547; G01R 31/318555; G01R 31/318594; G01R 31/3187

See application file for complete search history.

(56) References Cited

U.S. PATENT DOCUMENTS

| | | | | |
|---|---|---|---|---|
| 7,761,755 B1 * | 7/2010 | Payakapan | ....... | G01R 31/31922 713/500 |
| 2014/0292385 A1 * | 10/2014 | Bahl | ....... | H03K 3/012 327/144 |
| 2015/0198665 A1 * | 7/2015 | Srinivasan | ....... | G01R 31/31727 714/731 |

\* cited by examiner

*Primary Examiner* — Christian M Dorman
(74) *Attorney, Agent, or Firm* — Crowe & Dunlevy

(57) ABSTRACT

A test circuit receives LBIST and ATPG mode signals, and generates a first output as high when in ATPG or LBIST, and a second output as low when in ATPG or LBIST. A multiplexing circuit receives an ATPG clock and functional clock, and outputs one. A clock gate circuit includes a first latch receiving the second output, and an enable input receiving an inverse of the ATPG clock or functional clock. A second latch receives the first output, and has an enable input receiving the inverse of the ATPG clock or functional clock. The clock gate circuit includes a first AND gate receiving output of the first latch and ATPG clock or functional clock, a second AND gate receiving output of the second latch and the ATPG clock or LBIST clock, and an OR gate receiving outputs of the first and second AND gates, and generating a test clock.

22 Claims, 9 Drawing Sheets

CLOCK SELECTION CIRCUIT AND TEST CLOCK GENERATION CIRCUIT FOR LBIST AND ATPG TEST CIRCUIT

TECHNICAL FIELD

This disclosure is related to the field of test circuits for integrated circuits, and, more particularly, to clock selection and test clock generation circuits for test circuits capable of operating in both logic built-in self-test (LBIST) and automatic test pattern generation (ATPG) modes.

BACKGROUND

Despite advances in semiconductor processing and manufacturing technology, integrated circuits are manufactured with errors. Unfortunately, a single error can render an integrated circuit unusable. Accordingly, various techniques to identify faults in integrated circuits have been developed.

Two leading strategies used to test integrated circuit logic are automatic test pattern generation (ATPG) and logic built-in self-test (LBIST). ATPG works by applying patterns from an external tester and observing the results. BIST works by sending out test patterns generated by a pseudo-random pattern generator along scan chains and then collecting the responses in a multiple-input signature register (MISR). The final content of the MISR is a signature that determines the pass/fail result. The signature is typically compared to a pre-calculated, or expected, signature.

A clock different than the clock used by the integrated circuit during normal, functional operation is typically used when in a test mode. In fact, BIST uses one test clock, and ATPG mode uses two separate test clocks.

Glitches can occur during the process of switching the integrated circuit over from the functional clock to one of the test clocks, or from one test clock to another test clock. Circuitry capable of generating the test clocks to be used, and capable of switching between the various clocks in a glitch free fashion, is therefore desirable.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is a test circuit operable in automatic test pattern generation (ATPG) mode and logic built-in self-test (LBIST) mode. The test circuit includes a clock selection circuit with clock logic circuitry configured to receive as input an LBIST mode signal and an ATPG mode signal and to generate first and second outputs therefrom, the first output being high when the test circuit is operating in either ATPG mode or LBIST mode, the second output being low when the test circuit is operating in either ATPG mode or LBIST mode. A multiplexing circuit receives an ATPG clock and a functional clock as input, and outputs a selected one of the ATPG clock and the functional clock.

A clock gate circuit includes a first latch having a data input receiving the second output from the clock logic circuitry, an enable input receiving an inverse of the selected one of the ATPG clock and the functional clock, and an output, and a second latch having a data input receiving the first output from the clock logic circuitry, an enable input receiving the inverse of the selected one of the ATPG clock and the functional clock, and an output. The clock gate circuit also includes a first AND gate receiving as input the output of the first latch and the selected one of the ATPG clock and the functional clock, and generating an output, a second AND gate receiving as input the output of the second latch and the selected one of the ATPG clock and the LBIST clock, and generating an output, and an OR gate receiving as inputs the outputs of the first and second AND gates, and generating a test clock as an output.

A clock generation circuit may be for generating the ATPG clock, the clock generation circuit being operable in a reset phase, a shift mode, and a capture mode. The clock generation circuit may include a first circuit configured to perform a reset sequence in the reset phase, pass a shift clock for use in the shift mode, and to pass a PLL clock for use in the capture mode, and a first clock gate circuit configured to receive as input the passed shift clock or the passed PLL clock, and the ATPG mode signal, and to output a clock gate output signal. A state machine is coupled to the first clock gate circuit, and a second circuit coupled to the state machine and configured to generate the ATPG clock under control of the state machine. The state machine receives the clock gate output signal as input and is configured to, as a function thereof, when the first circuit is operating in the reset phase, output an output signal causing the first circuit to pass the shift clock, when the clock generation circuit is operating in shift mode, load the shift registers with a number of pulses needed during capture mode, and when the clock generation circuit is operating in capture mode, cause the second circuit to generate the ATPG clock as having a number of pulses equal to the number of pulses loaded in the shift registers.

DETAILED DESCRIPTION

Figure 1A:
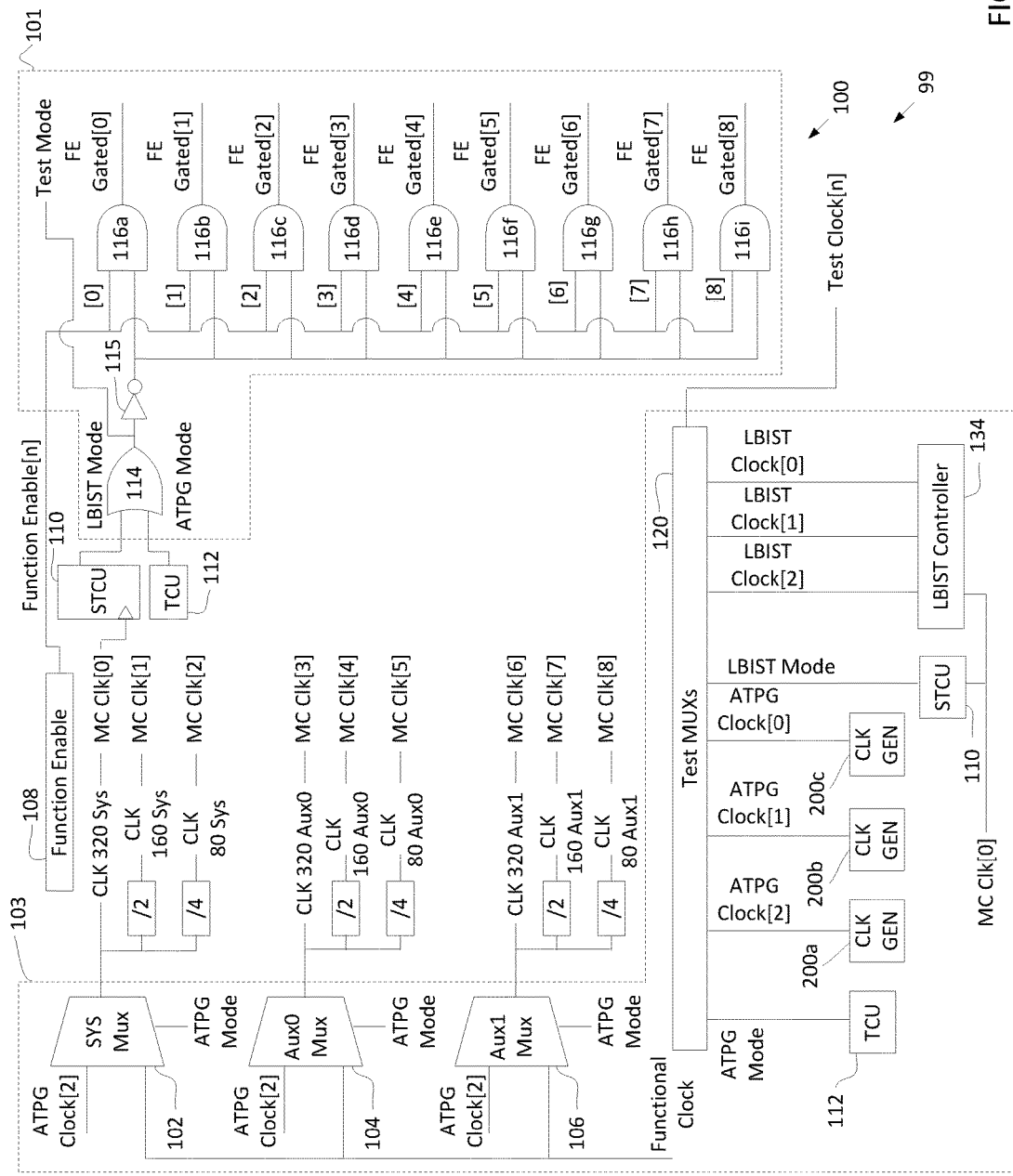
FIG. 1A is a schematic block diagram of a first portion of a clock selection circuit in accordance with this disclosure.

One or more embodiments of the present disclosure will be described below. These described embodiments are only examples of the presently disclosed techniques. Additionally, in an effort to provide a concise description, all features of an actual implementation may not be described in the specification.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, where an electronic component is referred to as having an "inverting input" or "inverting terminal", this is not intended to mean that the electronic component must perform the inverting function itself, and may instead in some cases mean that the signal to be fed to that input may be fed through an inverter prior to entry into the electronic component. Like reference numbers in the drawing figures refer to like elements throughout.

Figure 1B:
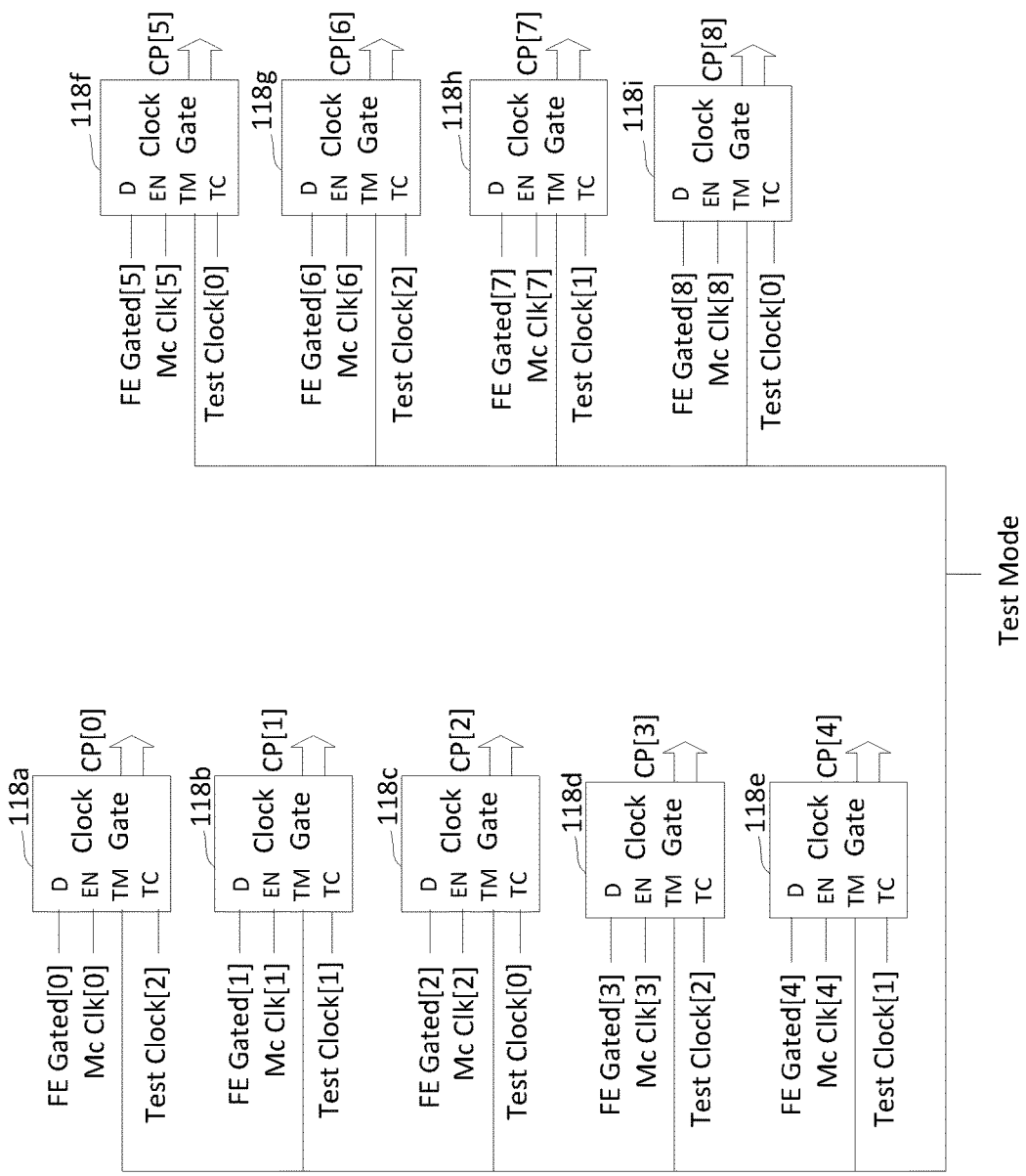
FIG. 1B is a schematic block diagram of a second portion of the clock selection circuit in accordance with this disclosure.

Depicted in FIGS. 1A-1B is a block diagram of an electronic device 99. The device 99 may be suitably implemented in an integrated circuit having one or more integrated circuit dies. Such integrated circuit dies are typically manufactured in wafers (not shown) and subsequently tested while still in the wafer form using a combination of ATPG and LBIST testing within each integrated circuit in the wafer as a system. External automated test equipment (ATE) is used during the ATPG testing, for example, for forcing certain signals to certain logic values.

The device 99 includes a clock selection circuit 100 for selecting and providing a clock CP to the device 99 for use in functional operation as well as during ATPG and LBIST operations. The clock selection circuit 100 includes clock logic circuitry 101 receiving as input a LBIST mode signal (indicating operation in LBIST mode is to occur) and an ATPG mode signal (indicating operation in ATPG mode is to occur, where ATPG mode is a logical OR between Stuck-at ATPG and At-speed ATPG signals, which represent different ATPG modes in which the device 99 can operate), and providing as output a first data output and a second data output, to a clock gate circuit 118. Assertion of the Stuck-at ATPG signal would indicate that the device 99 is to test for stuck-at faults, and assertion of the at-speed ATPG signal would indicate that the device 99 is to test for timing faults.

In greater detail, the clock logic circuit 101 includes an OR gate 114 receiving as input the LBIST mode signal from a self-test control unit (STCU) 110 and the ATPG mode signal from a test control unit (TCU) 112. The STCU and TCU may be separate components, or in some cases may be a single component. The OR gate 114 provides output through inverter 115 to AND gates 116a-116i. The AND gates 116a-116i also receive as input a Function Enable signal from a function enable block 108. The Function Enable signal is a bus, with each bit of Function Enable corresponding to a bit of MC Clk, and indicating whether that bit of MC Clk will be available at CP when device 99 is operating in functional mode. If the Function Enable signal is '1', the MC_clk bit will be available at CP, else CP will be '0'. Where ATPG mode='1', the device 99 is operating in ATPG mode, and where ATPG mode='0' and LBIST mode='1', the device 99 is operating in LBIST mode. When both ATPG mode='0' and LBIST mode='0', the device 99 is operating in functional mode.

A multiplexing circuit 103 provides a functional clock signal or an ATPG clock signal as an enable output to the clock gate circuit 118. The test multiplexing circuit 120 within multiplexing circuit 103 provides an LBIST clock signal or the ATPG clock signal as a test clock output to the clock gates 118a-118i. The ATPG clock signal and LBIST clock signal are both multi-bit busses.

The multiplexing circuit 103 includes a system multiplexer 102, first auxiliary multiplexer 104, and second auxiliary multiplexer 106. The multiplexers 102, 104, 106 receive as input the ATPG clock[2] and the functional clock, and pass the selected clock to the enable inputs of the latches in the clock gates 118a-118i, as will be explained below. The multiplexers 102, 104, 106 perform selection as a function of receipt of the ATPG mode signal. Where the functional clock is selected, the dividers (/2) and (/4) are activated and the functional clock is passed therethrough.

As depicted, MC Clk is a bus where MC Clk[0] is the clk_320_sys signal, MC Clk[1] is the clk_160_sys signal, MC Clk[2] is the clk_80_sys signal, MC Clk[3] is the clk_320_aux0 signal, MC Clk[4] is the clk_160_aux0 signal, MC Clk[5] is the clk_80_aux0 signal, MC Clk[6] is the clk_320_aux1 signal, MC Clk[7] is the clk_160_aux1 signal, and MC Clk[8] is the clk_80_aux1 signal. Output of the system multiplexer 102 in the form of the MC Clk[0] signal (CLK 320 sys) is also fed to a clock input of the STCU 110.

The multiplexing circuit 103 includes a test multiplexer circuit 120 controlled by the ATPG mode signal received from the TCU 112 and the LBIST mode signal received from the STCU 110. The test multiplexer circuit 120 outputs a selected clock, such as the ATPG clock (from the clock generation circuits 200a-200c) or LBIST clock (from the LBIST controller 134), to the clock gate circuits 118a-118i.

Figure 2:
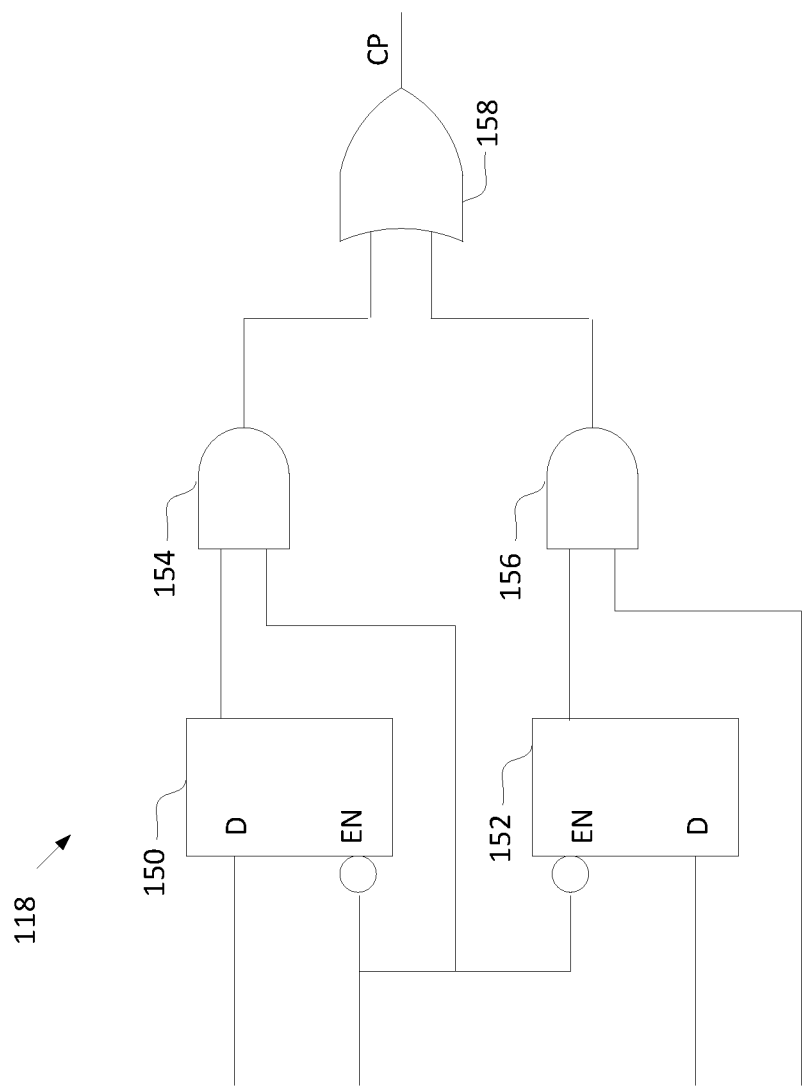
FIG. 2 is a schematic block diagram of clock gate circuits used in the clock selection circuit of FIG. 1B.

The clock gate circuits 118a-118i, as shown in FIG. 2, includes first and second latches 150 and 152, first and second AND gates 154 and 156, and an OR gate 158. The latch 150 receives at its data input the respective output FE Gated[n] from a corresponding AND gate 116a-116i, and at its inverting enable input the selected clock from MC Clk[n]. The AND gate 154 receives as input the output from the latch 150 and a non-inverted version of the selected clock from MC Clk[n]. The latch 152 receives at its data input the output Test Mode from OR gate 114, and at its inverting enable the selected clock from MC Clk[n]. The AND gate 156 receives as input the output from the latch 152 and the selected Test Clock[n] from the test muxes. The OR gate 158 receives as input the outputs from the AND gates 154 and 156, and provides the clock output CP at its output.

Operation of the clock selection block 100 will now be described. Prior to entry into ATPG mode, the clock selection block 100 serves to output the functional clock. To that end, the ATPG mode signal is not asserted (indicating that the device 99 is not in ATPG mode), causing selection and output of the functional clock by the muxes 102, 104, 106. Since the device 99 is not operating in ATPG mode or in LBIST mode, the function enable block 108 serves to output respective asserted Function Enable[n] signals to the AND gates 116a-116i. As previously explained, the Function Enable[n] signals can be '1' or '0'. The function enable block 108 is driven by set of programming registers which default to being asserted after power-up of the device 99, but later can be programmed by a CPU to assert or deassert. Since both the ATPG mode signal and LBIST mode signal are low at this point, the OR gate 114 output is deasserted. The AND gates 116a-116i will then assert their outputs to the first data input of their respective clock gate circuit 118a-118i, and each coupled MC Clk[n] bit will pass the functional clock to the first enable input of its respective clock gate circuit 118a-118i, resulting in the clock gate circuits 118a-118i outputting CP as following the functional clock.

When the device 99 enters ATPG mode, the ATPG Mode signal is asserted, causing selection of the ATPG clock by the muxes 102, 104, 106, as well as the test muxes 120. Since the ATPG Mode signal is high, the OR gate 114 will assert its output, resulting in the AND gates 116a-116i deasserting their outputs, with the result being that the latches 150 do not assert their outputs regardless of the value of ATPG clock. However, the latches 152 will receive the asserted output of the OR gate 114 at their data inputs, thus their outputs will be asserted regardless of the value of ATPG clock. Therefore, AND gate 156 will pass ATPG clock coming from test MUX 120 to OR gate 158, which outputs the ATPG clock signal as CP[n].

When the device 99 enters LBIST mode, the LBIST Mode signal is asserted, causing selection of the LBIST clock by the test muxes 120. The muxes 102, 104, and 106 continue to select the functional clock. Since the LBIST Mode signal is high, the OR gate 114 will assert its output, resulting in the AND gates 116a-116i deasserting their outputs, with the result being that the latches 150 do not assert their output regardless of the value of functional clock (as functional clock here is the enable of latches 150 and 152). However, the latches 152 will receive the asserted output of the OR gate 114 at their data inputs, thus their output will be asserted regardless of the value of functional clock. Resultingly, AND gates 156 will pass LBIST clock coming from testmux 120 to OR gates 158, which output the LBIST clock as CP[n].

Figure 5:
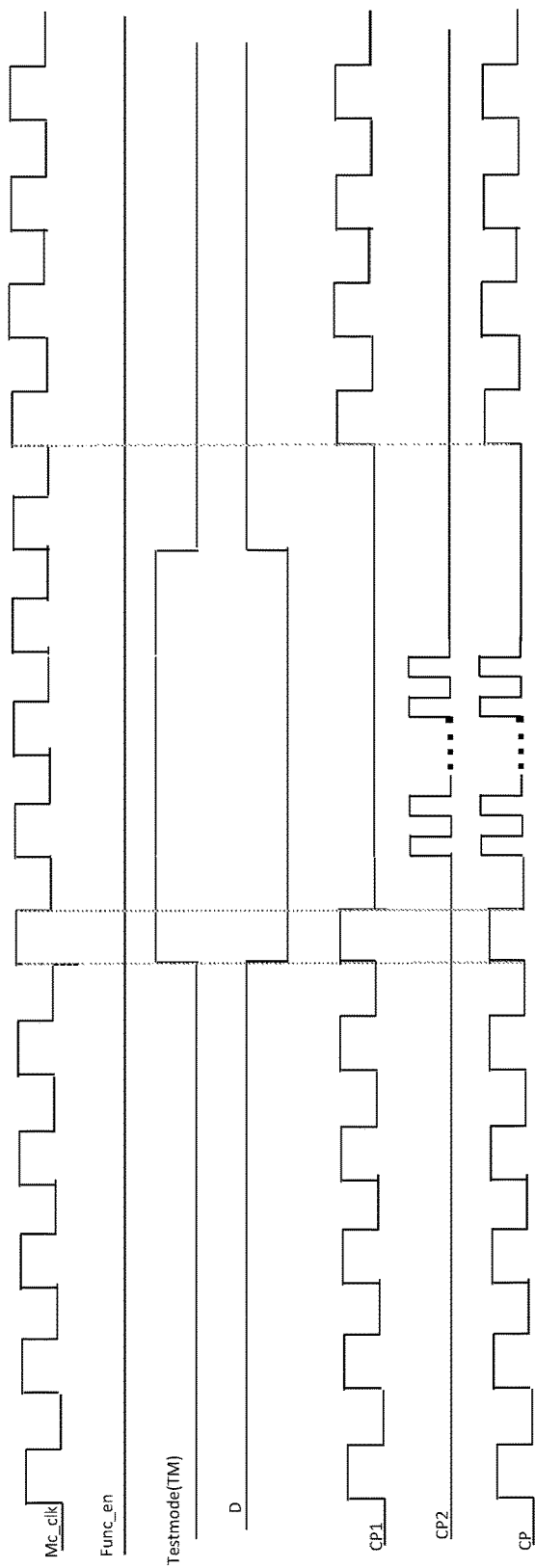
FIG. 5 is a timing diagram of output of the clock selection circuit in operation.

Shown in FIG. 5 is a timing diagram of operation of the clock selection block 100. CP1 and CP2 in FIG. 5 represent the outputs of AND gates 154 and 156, and CP[n] represents the generated ATPG or LBIST clock (CP[n] is ATPG clock when ATPG mode='1', and LBIST clock when ATPG mode='0' and LBIST mode='1'). As can be seen, the switchover of the ATPG or LBIST clock when test mode is enabled and disabled is glitch free. Of note in FIG. 5 is that this timing diagram depicts entry into LBIST mode from functional mode, and exit from LBIST mode to functional mode. This is a pessimistic case for proper operation, as it occurs where the functional clock is based on the signal from PLL clock, as LBIST controller 134 is clocked by the functional clock, and thus the LBIST controller 134 is capable of providing the LBIST clock on the next functional clock pulse. Entry from functional mode to ATPG mode, and exit from ATPG mode back to functional mode is a switchover less prone to errors than entry into and exit from LBIST mode since Scan Enable will be high and thus shift clock can be forced low at that time. Similarly, when ATPG mode is exited, Scan Enable will also be high, so ATPG Clock at this time will follow shift clock and be zero.

Figure 3A:
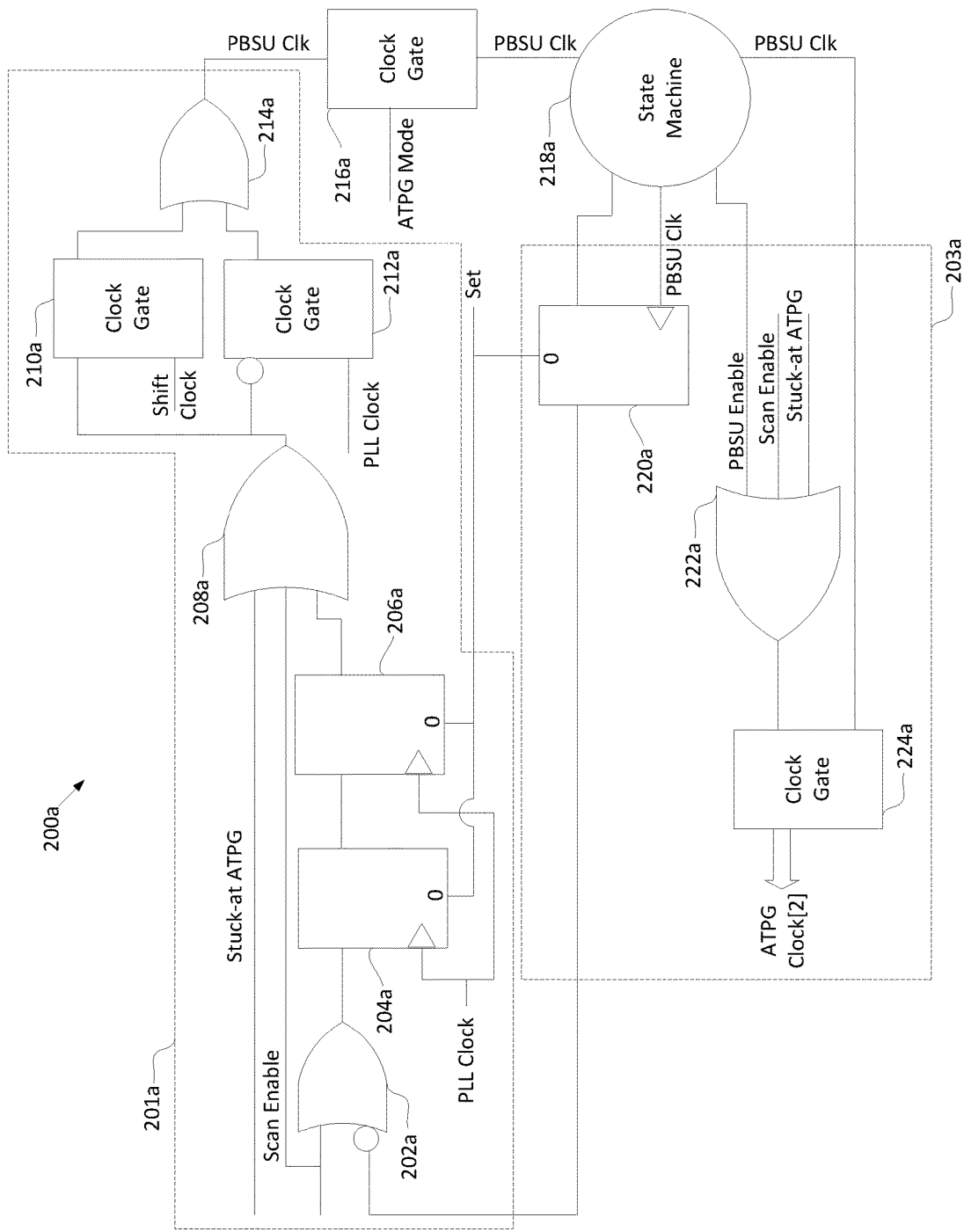
FIG. 3A is a schematic block diagram of a first portion of an ATPG clock generation circuit in accordance with this disclosure.
Figure 3B:
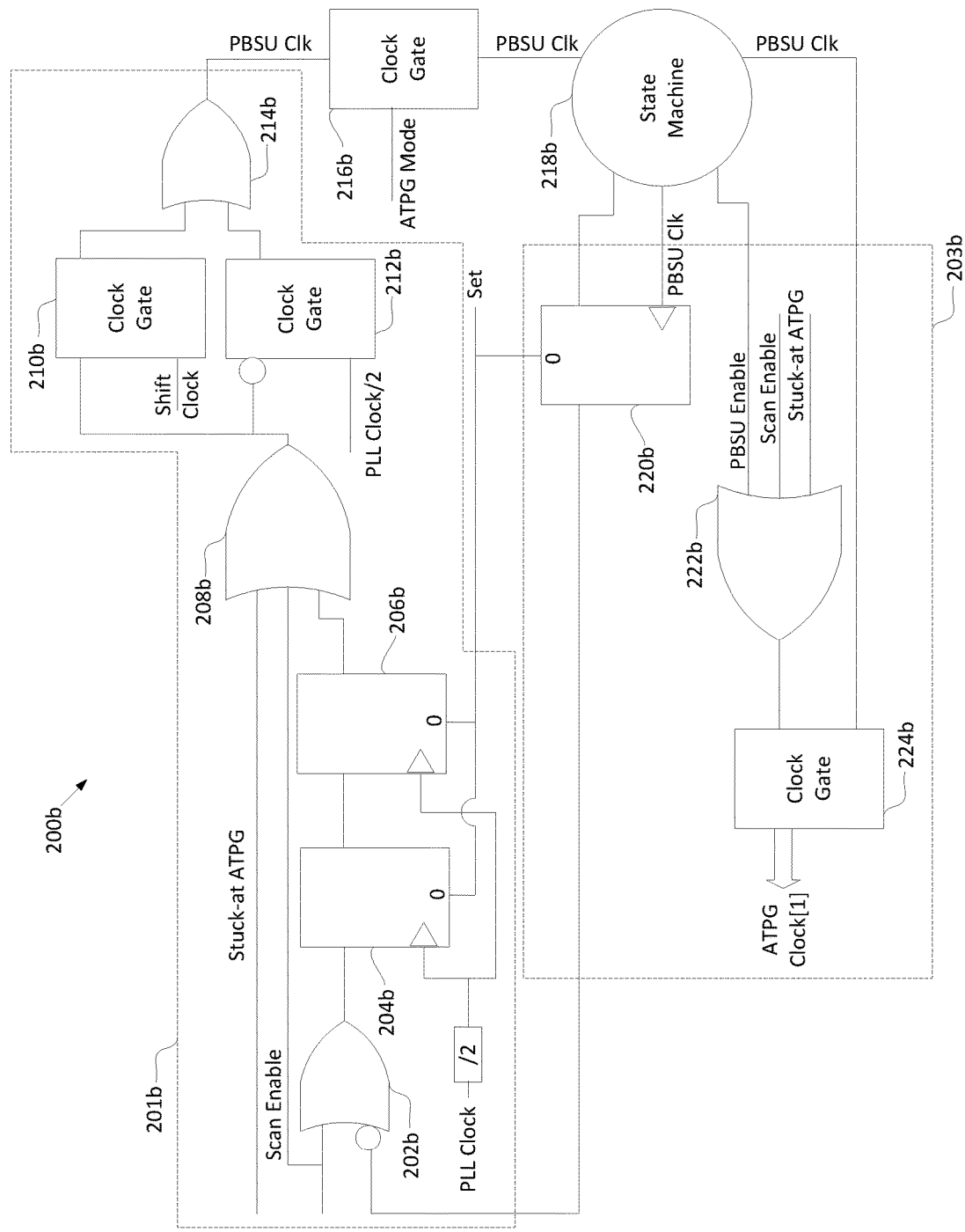
FIG. 3B is a schematic block diagram of a second portion of an ATPG clock generation circuit in accordance with this disclosure.
Figure 3C:
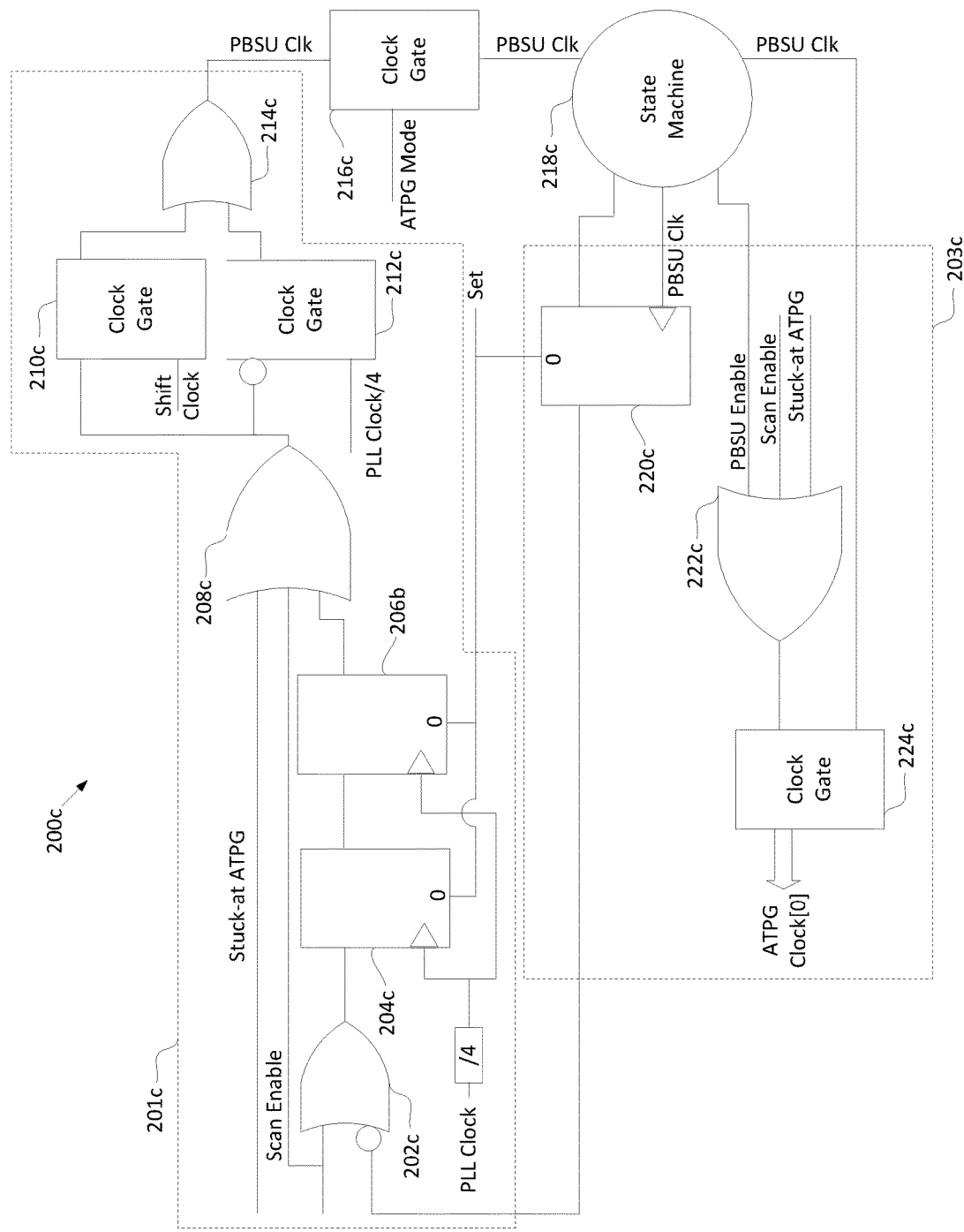
FIG. 3C is a schematic block diagram of a third portion of an ATPG clock generation circuit in accordance with this disclosure.

Depicted in FIGS. 3a-3c are the clock generation circuits 200a-200c. The clock generation circuits 200a-200c include first circuits 201a-201c receiving as input a Stuck-at ATPG signal (indicating the test clock suitable for finding stuck-at errors it to be used in ATPG mode) and scan enable signal (indicating whether the ATPG operation is operating in shift mode or capture mode) from an ATE, and a control signal from second circuits 203a-203c. The first circuits 201a-201c also receive a shift clock signal from the ATE. The first circuit 201a receives a phase locked loop (PLL) clock signal from a PLL in the device 99, the first circuit 201b receives a PLL/2 clock signal from a/2 divider, and the first circuit 201c receives a PLL/4 clock signal from a /4 divider. The first circuits 201a-201c generate clock signals PBSU CLK at their outputs.

Clock gate circuits 216a-216c receive output of the first circuits 201a-201c at their enable inputs, receive the ATPG mode signal at their data inputs, and provide their outputs to state machines 218a-281c.

Second circuits 203a-203c receive multiple inputs from the state machines 218a-218c, as well as the Scan Enable signal and the Stuck-at ATPG signal. The second circuits 203a-203c generate the ATPG Clock at their outputs.

In greater detail, the first circuits 201a-201c include OR gates 202a-202c receiving as input the Scan Enable signal, and an inverted version of the control signal output from the second circuits 203a-203c. Flip flops 204a-204c receive output of the OR gates 202a-202c at their data inputs. Flip flop 204a receives the PLL clock at its clock input, flip flop 204b receives the PLL/2 clock at its clock input, and flip flop 204c receives the PLL/4 clock at its clock input. Flip flops 206a-206c receive output of the flip flops 204a-204c at their data inputs. Flip flop 206a receives the PLL clock at its clock input, flip flop 206b receives the PLL/2 clock at its clock input, and flip flop 206c receives the PLL/4 clock at its clock input. OR gates 208a-208c receive as input the Stuck-at ATPG signal, the Scan Enable signal, and output from the flip flops 206a-206c. Clock gate circuits 210a-210c receive non-inverted output from the OR gates 208a-208c at their data inputs, and the shift clock at their enable inputs.

Clock gate circuit 212a receives inverted output from the OR gate 208a at its data input, and the PLL clock at its enable input. Clock 212b receives inverted output from the OR gate 208b at its data input, and the PLL clock/2 at its enable input. Clock 212c receives inverted output from the OR gate 208c at its data input, and the PLL clock/4 at its enable input.

The clock gate circuits 210a-210c and 212a-212c provide output to the OR gates 214a-214c, which in turn provide their outputs as the clock signal PBSU CLK. The clock gate circuits 216a-216c receive the clock signal PBSU CLK at their enable inputs, and the ATPG Mode signal at their data inputs.

The second circuits 203a-203c include flip flops 220a-220c receiving output from the state machines 218a-218c at their data inputs, clock inputs from PBSU CLK, and provide their outputs as control signals to the OR gates 202a-202c. The second circuits 203a-203c also include OR gates 222a-222c that receives as input enable signals PBSU CLK from the state machines 218a-218c, the Scan Enable signal, and the Stuck-at ATPG signal. Clock gates 224a-224c receive output from the OR gates 222a-222c at their data inputs, the clock signals PBSU CLK at their enable inputs, and provide their output as the ATPG Clock[n] bits.

Figure 4:
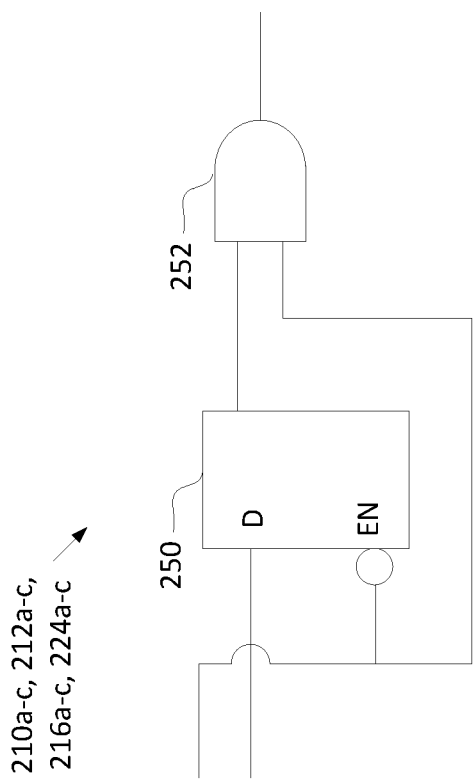
FIG. 4 is a schematic block diagram of clock gate circuits used in the clock generation circuits of FIG. 3A-3C.

The clock gate circuits 210a-210c, 212a-212c, 216a-216c, and 224a-224c are now generally described with reference to FIG. 4. Each of these clock gate circuits 210a-210c, 212a-212c, 216a-216c, and 224a-224c includes its own latch 250a-250c. The data input of the latches 250s correspond to the data inputs of the clock gate circuits 210a-210c, 212a-212c, 216a-216c, and 224a-224c, and the inverted enable inputs of the latches 250a-250c correspond to the enable inputs of the clock gate circuits 210a-210c, 212a-212c, 216a-216c, and 224a-224c. AND gates 252a-252c receive as input the outputs of the latches 250a-250c as well as the non-inverted inputs to the enable inputs of the latches 250a-250c. The outputs of the AND gates 252a-252c correspond to the outputs of the clock gate circuits 210a-210c, 212a-212c, 216a-216c, and 224a-224c.

Operation of the clock generation circuits 200a-200c will now be described. Initially, the clock generation circuits 200a-200c operate in a reset phase. In the reset phase, the Set signal is pulsed, setting the outputs of the flip flops 204a-204c, 206a-206c, 220a-220c. When the ATPG Mode signal is asserted, indicating entry of the device 99 into ATPG mode, the PLL Clock signal is deasserted, and the ATE forces the shift clock to deassert. Since OR gates 208a-208c are receiving an asserted signal from flip flop 206a-206c at this point, clock gates 210a-210c pass the shift clock through to OR gates 214a-214c, and the clock signals PBSU CLK follows shift clock. The state machines 218a-218c then generate the enable signals PBSU Enable as being deasserted, thereby de-enabling the clock gate circuits 224a-224c.

The ATE then asserts the Scan Enable signal. At this point, shift clock, the Stuck-at ATPG signal, the clock signals PBSU CLK, and the enable signals PBSU Enable remain deasserted. Due to assertion of the Scan Enable signal, output of the OR gates 208a-208c remain asserted, and clock gate circuits 210a-210c remain as passing shift clock. After waiting a sufficient period of time for the PLL Clock signal to lock, the ATE deasserts the Scan Enable signal.

Resultingly, the outputs of OR gates 202a-202c are deasserted. It follows then that, within three cycles of the PLL Clock signal, the outputs of the flip flops 206a-206c are deasserted, resulting in the output of the OR gates 208a-208c being deasserted, the clock gate circuits 210a-210c blocking the shift clock signal, and the clock gate circuits 212a-212c passing the PLL clock signal, PLL clock signal/2, and PLL clock signal/4. The OR gates 214a-214c pass the PLL clock signal, PLL clock signal/2, and PLL clock signal/4 as the clock signals PBSU Clk to the clock gate circuits 216a-216c.

Thereafter, the state machines 218a-218c causes the flip flops 220a-220c to deassert their outputs. This ultimately serves to cause the outputs of the flip flops 206a-206c to be asserted, resulting in the OR gates 208a-208c asserting their outputs to cause the clock gate circuits 212a-212c to block the PLL Clock signal, PLL Clock Signal/2, and PLL Clock Signal/4, and to cause the clock gate circuits 210a-210c to pass the Shift Clock signal. The Shift Clock signal is passed through the OR gates 214a-214c, through clock gate circuits 216a-216c, and to the state machines 218a-218c and clock gates 224a-224c. During the reset phase, state machines 218a-218c keep the control signals PBSU Enable deasserted, as well as keeping scan enable and stuck-at ATPG both deasserted, thereby causing shift clock to be blocked at clock gates 224a-224c.

The reset phase is now complete, and shift mode begins. In shift mode, the ATE asserts Scan Enable and pulses Shift Clock, and the state machines 218a-218c cause the flip flops 220a-220c to assert their outputs, and load internal registers with a number equal to a number of clock cycles to be used during capture mode. When scan_enable='1', shift clock is allowed to pass through clock gates 224a-224c and is available as the ATPG clock[n] outputs. Shift Clock is then pulsed the requisite number of times for use by the device 99 to shift data in and out of ATPG scan chains.

Capture mode is then entered, and the ATE deasserts Scan Enable, resulting in the OR gates 202a-202c deasserting their outputs, and thus the flip flops 206a-206c deasserting their outputs, and the consequential passing of PLL clock, PLL clock/2, and PLL clock/4 by clock gate circuits 212a-212c and blocking of Shift Clock by clock gate circuits 210a-210c. Resultingly, the PLL clock, PLL clock/2, and PLL clock/4 is passed through OR gates 214a-214c as clock signals PBSU Clk. The state machines 218a-218c then pulse the enable signals PBSU Enable a number of times equal to the number stored in the internal shift registers, resulting in the clock gate circuits 224a-224c generating a number of ATPG clock pulses equal to that number.

Shift mode and capture mode may be repeated a suitable number of times so as to effectuate the desired ATPG testing.

The combination of the clock selection circuit 100 and clock generation circuits 200a-200c provide for glitch free clock selection and switchover between output of the functional clock to output of the LBIST clock and vice versa, and between different clock speeds during ATPG mode. In addition, the combination of the clock selection circuit 100 and clock generation circuits 200a-200c provide for a 50% duty cycle for each of these various possible clock outputs.

Figure 6:
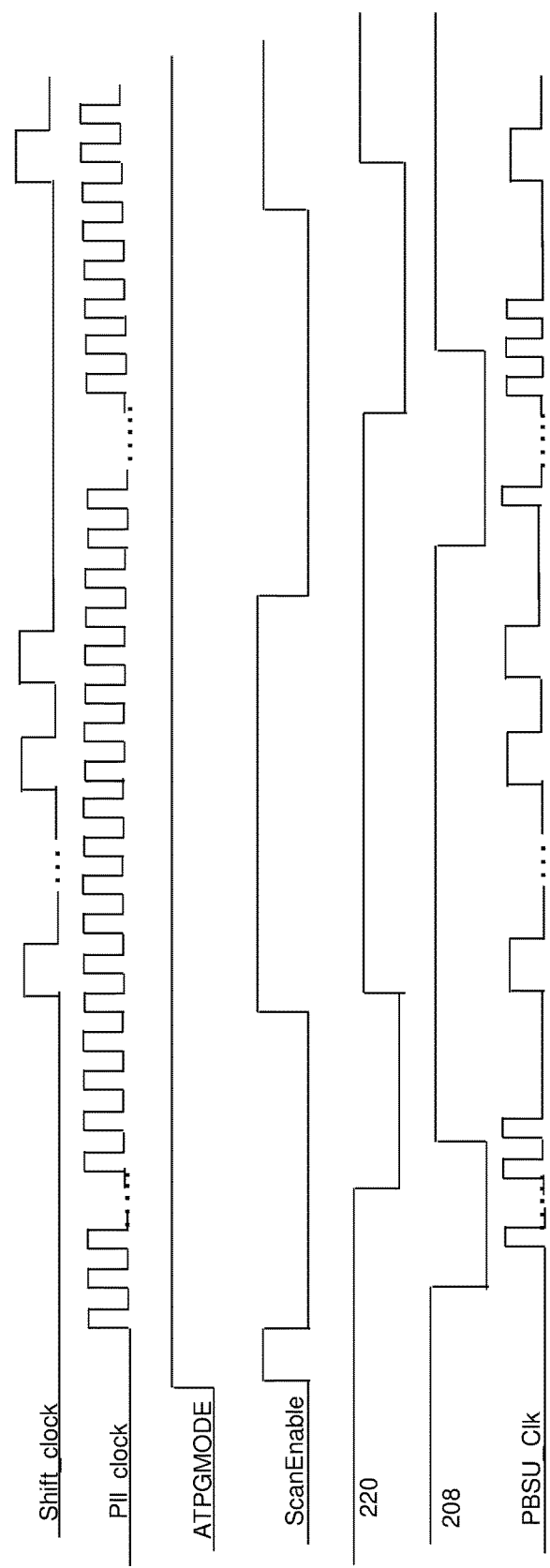
FIG. 6 is a timing diagram of the ATPG clock generation circuit in operation.

Shown in FIG. 6 is a timing diagram of operation of the ATPG clock generation circuits 200a-200c.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. A test circuit operable in automatic test pattern generation (ATPG) mode and logic built-in self-test (LBIST) mode, the test circuit comprising:
    a clock selection circuit comprising:
        clock logic circuitry configured to receive as input an LBIST mode signal and an ATPG mode signal, and to generate first and second outputs therefrom, the first output being high when the test circuit is operating in either ATPG mode or LBIST mode, the second output being low when the test circuit is operating in either ATPG mode or LBIST mode;
        a multiplexing circuit receiving an ATPG clock and a functional clock as input, and outputting a selected one of the ATPG clock and the functional clock;
        a clock gate circuit comprising:
            a first latch having a first latch data input receiving the second output from the clock logic circuitry, a first latch enable input receiving an inverse of the selected one of the ATPG clock and the functional clock, and a first latch output,
            a second latch having a second latch data input receiving the first output from the clock logic circuitry, a second latch enable input receiving the inverse of the selected one of the ATPG clock and the functional clock, and a second latch output,
            a first AND gate receiving as input the first latch output of the first latch and the selected one of the ATPG clock and the functional clock, and generating an a first AND gate output,
            a second AND gate receiving as input the second latch output of the second latch and the selected one of the ATPG clock and the LBIST clock, and generating a second AND gate output, and
            an OR gate receiving as inputs the first AND gate output and the second AND gate output, and generating a test clock as a clock gate circuit OR gate output.

2. The test circuit of claim 1, wherein the clock logic circuitry comprises:

a clock logic circuitry OR gate receiving as input the LBIST mode signal and the ATPG mode signal, and generating an a clock logic circuitry OR gate output; and a clock logic circuitry AND gate receiving a functional clock enable signal and an inverse of the clock logic circuitry OR gate output of the clock logic circuitry OR gate as input, and generating the first output as output.

3. The test circuit of claim 1, wherein the LBIST mode signal is generated by a self-test control unit.

4. The test circuit of claim 1, wherein the LBIST clock is generated by a LBIST controller.

5. The test circuit of claim 1, further comprising a clock generation circuit for generating the ATPG clock, the clock generation circuit being operable in a reset phase, a shift mode, and a capture mode, the clock generation circuit comprising:
 a first circuit configured to perform a reset sequence in the reset phase, pass a shift clock for use in the shift mode, and to pass a PLL clock for use in the capture mode;
 a first clock gate circuit configured to receive as input the passed shift clock or the passed PLL clock, and the ATPG mode signal, and to output a clock gate output signal;
 a state machine coupled to the first clock gate circuit;
 a second circuit coupled to the state machine and configured to generate the ATPG clock under control of the state machine;
 the state machine receiving the clock gate output signal as input and configured to, as a function thereof:
  when the first circuit is operating in the reset phase, output an output signal causing the first circuit to pass the shift clock,
  when the clock generation circuit is operating in the shift mode, load shift registers with a number of pulses needed during the capture mode, and
  when the clock generation circuit is operating in the capture mode, cause the second circuit to generate the ATPG clock as having a number of pulses equal to the number of pulses loaded in the shift registers.

6. The test circuit of claim 5, wherein the first circuit comprises:
 a first circuit first OR gate receiving as input a stuck-at ATPG signal, a scan enable signal, and a shift clock pass signal, and generating a first OR output;
 a third clock gate circuit having a third clock gate data input receiving the first OR output, third clock gate enable input receiving the shift clock, and generating a third clock gate output;
 a fourth clock gate circuit having a fourth clock gate data input receiving an inverse of the first OR output, a fourth clock gate enable input receiving the PLL clock, and generating a fourth clock gate output; and
 a first circuit second OR gate receiving as input the third and fourth clock gate outputs, and generating output to a first clock gate circuit enable input of the first clock gate circuit.

7. The test circuit of claim 6, wherein the stuck-at ATPG signal indicates that the ATPG circuit is to test for stuck-at faults; wherein the scan enable signal indicates whether the ATPG circuit is in the shift mode or the capture mode; wherein the ATPG mode signal represents an output of a logical OR between the stuck-at ATPG signal and an at-speed ATPG signal; wherein the at-speed ATPG signal indicates that the ATPG circuit is to test for timing faults.

8. The test circuit of claim 6, wherein the first clock gate circuit receives the ATPG mode signal at its data input.

9. The test circuit of claim 6, wherein the clock generation circuit further comprises a delay block generating the shift clock pass signal as a function of a signal representing a logical OR between the scan enable signal and an inverse of the output signal from the state machine.

10. The test circuit of claim 9, wherein the delay block comprises first and second flip flops in series, the first and second flip flops having clock inputs receiving the PLL clock, the first flip flop having a data input receiving the signal representing the logical OR between the scan enable signal and an inverse of the output signal from the state machine, the second flip flop having a data input receiving output from the first flip flop.

11. The test circuit of claim 9, wherein the second circuit comprises a flip flop having a clock input receiving output from the first clock gate circuit, a flip flop data input receiving output from the state machine, and an a flip flop output passing the output signal from the state machine; and wherein the state machine, when the first circuit is operating in the reset phase, sets the flip flop of the second circuit, and sets the flip flops of the delay block; wherein the shift clock is low when the first circuit is operating in the reset phase;
 wherein the scan enable signal is high during an unlocked PLL phase when the first circuit is operating in the reset phase, and is low during a locked PLL phase when the first circuit is operating in the reset phase; wherein the first circuit passing the PLL clock results in the state machine resetting the flip flop of the second circuit.

12. The test circuit of claim 6, wherein the scan enable signal is high when the clock generation circuit is operating in the shift mode, and is low when the clock generation circuit is operating in the capture mode.

13. The test circuit of claim 5, wherein the second circuit comprises:
 a flip flop having a clock input receiving output from the first clock gate circuit, a flip flop data input receiving output from the state machine, and a flip flop output passing the output signal from the state machine;
 a second circuit OR gate receiving as input an ATPG clock enable signal, the scan enable signal, and the stuck-at ATPG signal, and generating a second circuit OR gate output;
 a second clock gate circuit having a first input receiving the clock gate output signal, a second input receiving the output from the second circuit OR gate, and a second clock gate circuit output generating the ATPG clock.

14. A clock generation circuit for generating an automatic test pattern generation (ATPG) clock for an ATPG circuit operable in a reset phase, a shift mode, and a capture mode, the clock generation circuit comprising:
 a first circuit configured to perform a reset sequence in the reset phase, pass a shift clock for use in the shift mode, and to pass a PLL clock for use in the capture mode;
 a first clock gate circuit configured to receive as input the passed shift clock or the passed PLL clock, and an ATPG mode signal, and to output a clock gate output signal;
 a state machine coupled to the first clock gate circuit;
 a second circuit coupled to the state machine and configured to generate the ATPG clock under control of the state machine;
 wherein the state machine receives the clock gate output signal as input and is configured to, as a function thereof:

when the first circuit is operating in the reset phase, output an output signal causing the first circuit to pass the shift clock, when the clock generation circuit is operating in the shift mode, load the shift registers with a number of pulses needed during the capture mode, and when the clock generation circuit is operating in the capture mode, cause the second clock gate circuit to generate the ATPG clock as having a number of pulses equal to the number of pulses loaded in the shift registers.

15. The clock generation circuit of claim 14, wherein the first circuit comprises:

a first OR gate receiving as input a stuck-at ATPG signal, a scan enable signal, and a shift clock pass signal, and generating a first OR output;

a third clock gate circuit having a data input receiving the first OR output, an enable input receiving the shift clock, and generating a third clock gate output;

a fourth clock gate circuit having a data input receiving an inverse of the first OR output, an enable input receiving the PLL clock, and generating a fourth clock gate output; and a second OR gate receiving as input the third and fourth clock gate outputs, and generating output to an enable input of the first clock gate circuit.

16. The clock generation circuit of claim 15, wherein the stuck-at ATPG signal indicates that the ATPG circuit is to test for stuck-at faults; wherein the scan enable signal indicates whether the ATPG circuit is in the shift mode or the capture mode; wherein the ATPG mode signal represents an output of a logical OR between the stuck-at ATPG signal and an at-speed ATPG signal; wherein the at-speed ATPG signal indicates that the ATPG circuit is to test for timing faults.

17. The clock generation circuit of claim 15, wherein the first clock gate circuit receives the ATPG mode signal at its data input.

18. The clock generation circuit of claim 15, further comprising a delay block generating the shift clock pass signal as a function of a signal representing a logical OR between the scan enable signal and an inverse of the output signal from the state machine.

19. The clock generation circuit of claim 18, wherein the delay block comprises first and second flip flops in series, the flip flops having clock inputs receiving the PLL clock, the first flip flop having a first flip flop data input receiving the signal representing the logical OR between the scan enable signal and an inverse of the output signal from the state machine, the second flip flop having a second flip flop data input receiving output from the first flip flop.

20. The clock generation circuit of claim 18, wherein the second circuit comprises a flip flop having a clock input receiving output from the first clock gate circuit, a second circuit flip flop data input receiving output from the state machine, and a second circuit flip flop output passing the output signal from the state machine; and wherein the state machine, when the first circuit is operating in the reset phase, sets the flip flop of the second circuit, and sets the flip flops of the delay block; wherein the shift clock is low when the first circuit is operating in the reset phase; wherein the scan enable signal is high during an unlocked PLL phase when the first circuit is operating in the reset phase, and is low during a locked PLL phase when the first circuit is operating in the reset phase; wherein the first circuit passing the PLL clock results in the state machine resetting the flip flop of the second circuit.

21. The clock generation circuit of claim 15, wherein the scan enable signal is high when the clock generation circuit is operating in the shift mode, and is low when the clock generation circuit is operating in the capture mode.

22. The clock generation circuit of claim 14, wherein the second circuit comprises:

a flip flop having a clock input receiving output from the first clock gate circuit, a data input receiving output from the state machine, and an output passing the output signal from the state machine;

an OR gate receiving as input an ATPG clock enable signal, the scan enable signal, and the stuck-at ATPG signal, and generating an output;

a clock gate circuit having a first input receiving the clock gate output signal, a second input receiving the output from the OR gate, and an output generating the ATPG clock.

* * * * *